(12) United States Patent
Quail et al.

(10) Patent No.: US 11,380,212 B2
(45) Date of Patent: Jul. 5, 2022

(54) GARMENT SUPPORTED ELECTRODE

(71) Applicant: Setcan Corporation, Winnipeg (CA)

(72) Inventors: Jeffrey James Quail, Winnipeg (CA); Michael Ness, Winnipeg (CA)

( * ) Notice: Subject to any disclaimer, the term of this patent is extended or adjusted under 35 U.S.C. 154(b) by 295 days.

(21) Appl. No.: 16/880,011

(22) Filed: May 21, 2020

(65) Prior Publication Data
US 2021/0366305 A1   Nov. 25, 2021

(51) Int. Cl.
| G09B 9/00 | (2006.01) |
| H01R 13/627 | (2006.01) |
| H05K 5/02 | (2006.01) |
| F41H 13/00 | (2006.01) |

(52) U.S. Cl.
CPC ......... *G09B 9/003* (2013.01); *H01R 13/6278* (2013.01); *H05K 5/0247* (2013.01); *F41H 13/0018* (2013.01)

(58) Field of Classification Search
CPC .... G09B 9/003; H01R 13/6278; H01R 13/20; H05K 5/0247
See application file for complete search history.

(56) References Cited

U.S. PATENT DOCUMENTS

| 3,841,312 | A | 10/1974 | Corasanti | |
| 9,055,879 | B2 * | 6/2015 | Selby | H01R 13/11 |
| 9,489,857 | B2 * | 11/2016 | Quail | A01K 15/023 |
| 10,874,351 | B2 * | 12/2020 | Chen | A61B 5/0002 |
| 2018/0146873 | A1 | 5/2018 | Tsukada et al. | |

FOREIGN PATENT DOCUMENTS

| CA | 2778941 | 8/2012 |
| CA | 2947960 | 9/2015 |
| JP | 2009160091 | 7/2009 |

* cited by examiner

*Primary Examiner* — Jean F Duverne
(74) *Attorney, Agent, or Firm* — Ryan W. Dupuis; Kyle R Satterthwaite; Ade & Company Inc.

(57) ABSTRACT

An electrode assembly attaches to a garment using a pad supporting one or more electrodes for mounting against an inner surface of the garment and a housing arranged to be supported externally on the garment. Connectors on the pad and the housing are arranged to be penetrated through the garment in a non-destructive manner to form a mechanical connection between the pad and the housing that also conductively connects the electrodes on the pad to an electronic component in the housing whereby an electrical signal can be communicated to the electrodes from the housing, for example to deliver an electrical impulse generated by the electronic component through the electrodes in a painful yet non-injurious manner to the user.

20 Claims, 5 Drawing Sheets

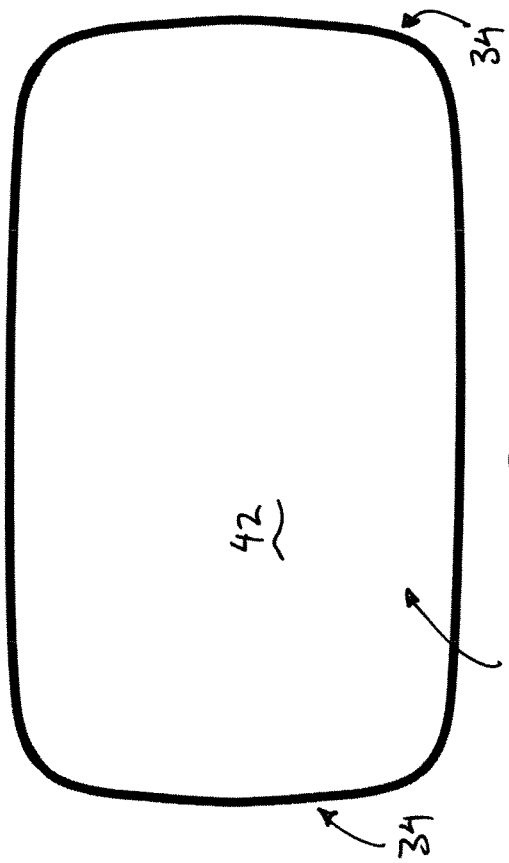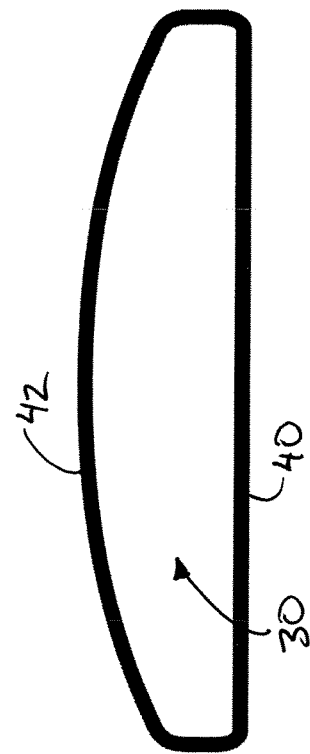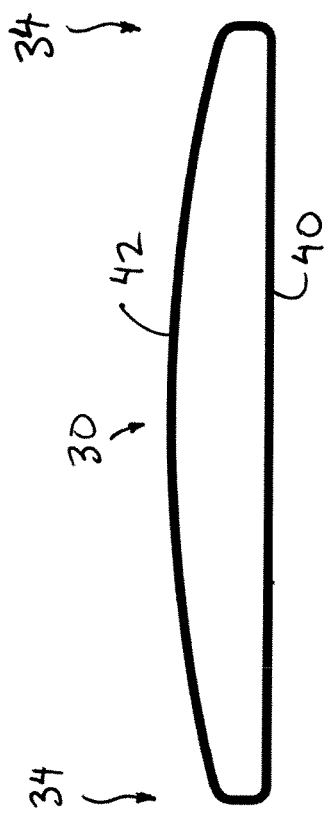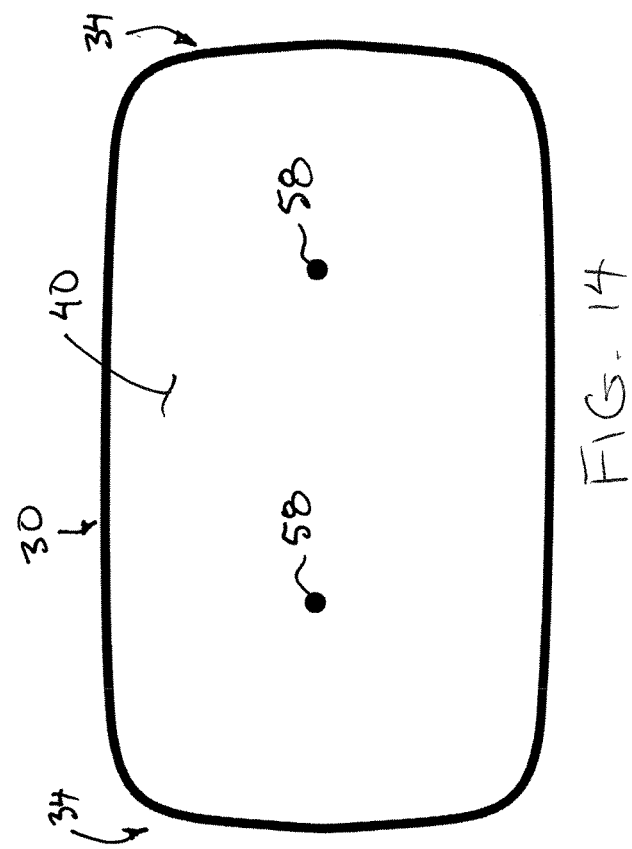

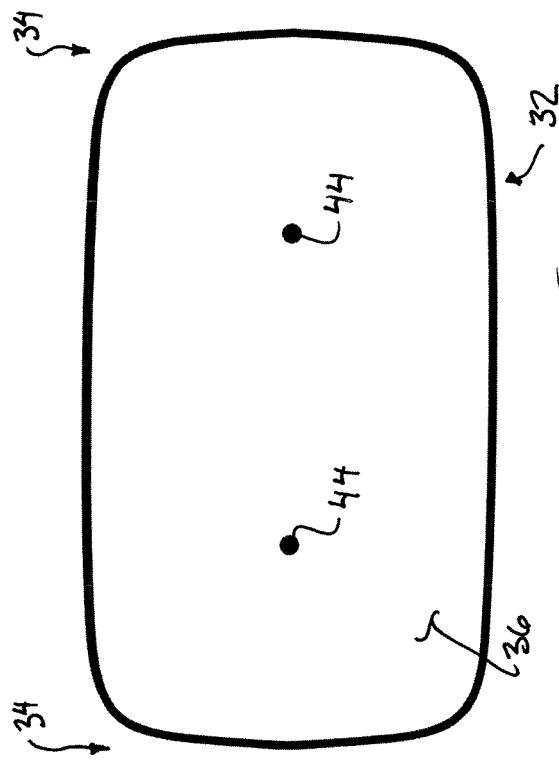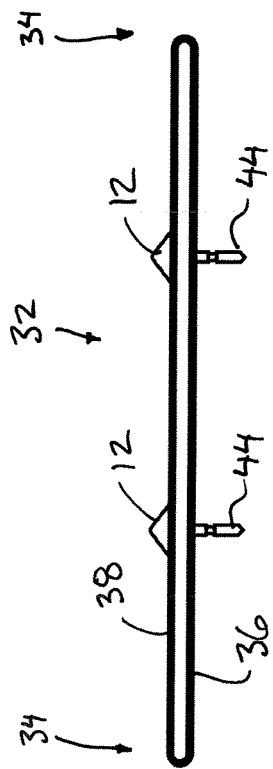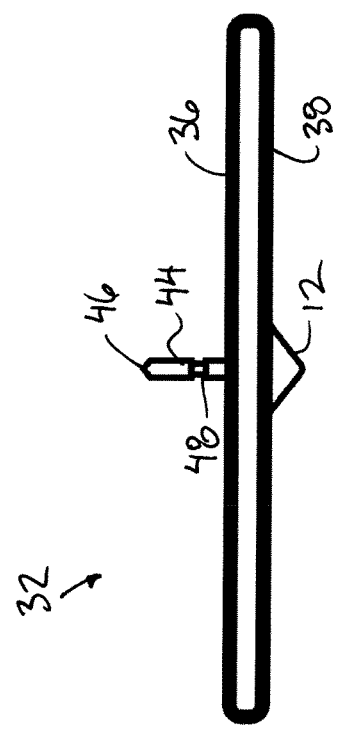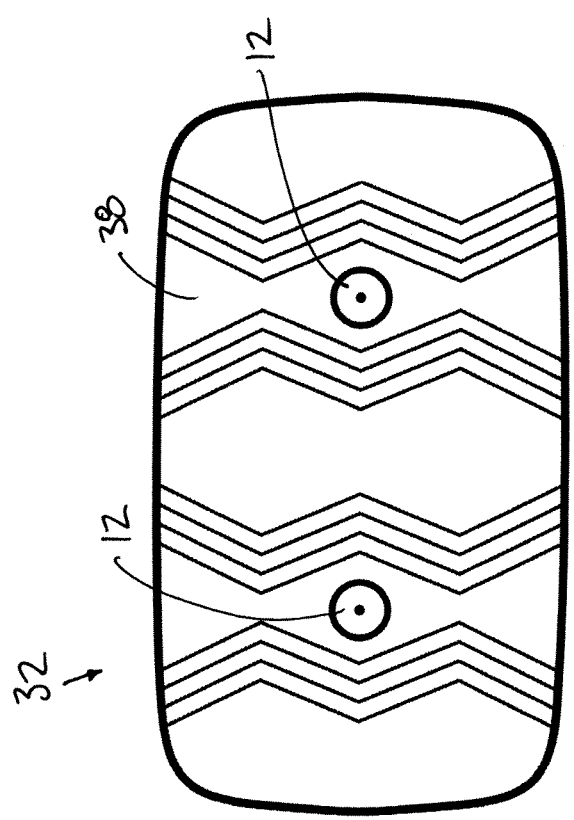

GARMENT SUPPORTED ELECTRODE

FIELD OF THE INVENTION

The present invention relates to an electrode for conductive contact with a body of a user, in which the electrode is detachably attached to garment to be worn on the body of the user.

BACKGROUND

In the field of combat simulation devices, it is known to deliver an electrical shock to a user through a pair of electrodes in close proximity to the skin of a user to simulate a combat injury. U.S. Pat. No. 9,489,857 by Jeffrey James Quail discloses an example of a device for controlling the characteristics of an electrical impulse to be delivered to a user through a pair of electrodes during stress exposure training. It is preferred that the electrodes be mounted directly against the skin of the user to ensure the electrical impulse is received by the user in the manner intended to effectively simulate a stress exposure environment. When using the device with multiple users, various adjustable mounting hardware may be required to accommodate users of different size and shape, and then the mounting hardware requires time consuming sanitation between use by different users.

Electrodes for forming direct contact with a user are known in the field of acquiring a biological signal emitted from a living body. In the instance of acquiring a biological signal, electrodes for forming an electrical contact with a user are known to be incorporated into garments, however, when relying on garments to support electrodes in contact with a user, a large variety of different sizes and shapes of garments are required to accommodate different users. United States Patent Application Publication No. US 2018/0146873, by Nippon Telegraph and Telephone Corporation and Toray Industries, discloses a biomedical electrode which is detachably attached to a garment and includes an electrode coming into contact with a living body clothed in the garment to acquire a biological signal emitted by the living body. The electrode connects through the garment using a post connector protruding from the electrode portion that contacts the user, in which the post connector has an enlarged head required to form a firm connection with a female connector at the exterior side of the garment. The shape of the enlarged head of the post connector requires a destructive slot to be formed in the garment to communicate through the fabric of the garment. Furthermore, the individual electrode can only be used for acquiring a biological signal emitted by the living body and is incapable of being used to deliver an electrical shock to a user due to the single contact of the electrode with the user.

SUMMARY OF THE INVENTION

According to one aspect of the invention there is provided an electrode assembly for attachment to a garment worn by a user, the garment having a fabric layer with an inner surface supported against the user and an outer surface opposite the inner surface at an exterior of the garment, the electrode assembly comprising:

a pad for mounting against the inner surface of the fabric layer;

at least one electrode mounted on the pad so as to be arranged to directly contact the user;

a first connector supported on the pad;

a housing arranged to be supported externally against the outer surface of the fabric layer, the housing including an electronic component therein;

a second connector supported on the housing;

one of the first connector and the second connector comprising a pin connector and another one of the first connector and the second connector comprising a socket connector;

the socket connector being arranged to receive the pin connector therein to releasably attach the housing to the pad in a mounted position of the assembly;

the pin connector being shaped to be self-penetrating through the fabric layer in a non-destructive manner so as to be arranged for insertion through the fabric layer between the pad at the inner surface and the housing at the outer surface in the mounted position; and said at least one electrode and the electronic component being in electrical communication with one another in the mounted position so as to be arranged to communicate an electrical signal between said at least one electrode and the electronic component on the housing in the mounted position.

The use of a pin connector which is self-penetrating through a fabric material in a non-destructive manner, allows the electrode to be mounted on a large variety of garments provided by the user without damaging the garment so that the garment can continue to be used as clothing after removal of the electrode.

In some embodiments, the use of two electrodes that communicate with a common housing allows electronics within the housing to be configured to deliver an electrical shock to the user in an effective manner, while maintaining the housing and most of the mounting hardware externally of the garment in a sanitary manner.

Preferably the pin connector includes a recess formed therein defining a catch arranged to be engaged by the socket connector. The recess may comprise an annular groove extending about a circumference of the pin connector.

The pin connector and the socket connector are preferably formed of conductive material defining a conductive path arranged to communicate the electrical signal between said at least one electrode and the electronic component on the housing in the mounted position.

The electrode may be conical in shape so as to be tapered outwardly from the pad towards an apex. Preferably the apex has an interior angle that is greater than 90 degrees.

Preferably a pair of electrodes are provided, in which each electrode has a respective first connector associated therewith which connects the electrode to the electronic component of the housing. The pad may be a single body commonly supporting both electrodes therein.

The pad preferably has an outer surface for engaging the user that is formed of a resilient, non-conductive, and electrically insulating material, for example a rubber-like material. The outer surface may also be textured for gripping the user.

The assembly preferably includes a battery supported on the housing so as to be arranged to deliver an electrical signal from the housing to the user through said at least one electrode.

When (i) the housing has an inner surface for abutment against the fabric layer bound by a prescribed perimeter shape of the housing and (ii) the pad has an inner surface for abutment against the fabric layer bound by a prescribed perimeter shape of the pad, preferably (iii) the prescribed perimeter shape of the housing and the prescribed perimeter shape of the pad being substantially identical to one another.

The housing may have an outer surface opposite the second connector on the housing that has a smooth convex shape so as to minimize the housing being caught on external objects.

The electronic component of the housing may include (i) a controller having a processor and a memory storing programming instructions arranged to be executed by the processor, and (ii) a transceiver connected to the controller so as to be arranged to communicate signals wirelessly between the controller and an external electronic device.

The electronic component of the housing may include an electrical impulse device supported on the housing in communication with said at least one electrode so as to be arranged to deliver an electrical impulse to the user through said at least one electrode that causes non-injurious pain to the user.

Alternatively, the electrical component of the housing may be arranged to (i) receive a biological signal that is (a) emitted by a body of the user and (b) acquired by said at least one electrode, and (ii) transmit the biological signal to an external electronic device.

According to a second aspect of the present invention there is provided an electrode assembly for attachment to a garment worn by a user, the garment having a fabric layer with an inner surface supported against the user and an outer surface opposite the inner surface at an exterior of the garment, the electrode assembly comprising:

two electrodes arranged to directly contact the user;

at least one pad supporting the electrodes thereon, wherein said at least one pad is arranged for mounting against the inner surface of the fabric layer;

a first connector supported on said at least one pad;

a housing arranged to be supported externally against the outer surface of the fabric layer, the housing including an electronic component therein;

a second connector supported on the housing in association with the first connector;

one of the first connector and the second connector comprising a pin connector and another one of the first connector and the second connector comprising a socket connector;

the socket connector being arranged to receive the pin connector therein to releasably attach the housing to the pad in a mounted position of the assembly; and the electrodes and the electronic component of the housing being in electrical communication with one another in the mounted position so as to be arranged to communicate an electrical signal between the electrode and the electronic component on the housing in the mounted position.

In the illustrated embodiment, the electronic component of the housing includes an electrical shock generator supported on the housing in communication with the electrodes so as to be arranged to deliver an electrical impulse to the user through the electrodes that causes non-injurious pain to the user. Preferably said at least one pad comprises a single body commonly supporting both electrodes therein.

BRIEF DESCRIPTION OF THE DRAWINGS

One embodiment of the invention will now be described in conjunction with the accompanying drawings in which:

FIGS. 11, 12, 13, and 14 are outer, top, side and inner views respectively of the housing of the electrode assembly separated from the pad that mounts the electrodes therein; and FIGS. 15, 16, 17 and 18 are inner, top, outer, and side views respectively of the pad that mounts the electrodes therein shown separated from the housing of the electrode assembly.

In the drawings like characters of reference indicate corresponding parts in the different figures.

DETAILED DESCRIPTION

Figure 1:
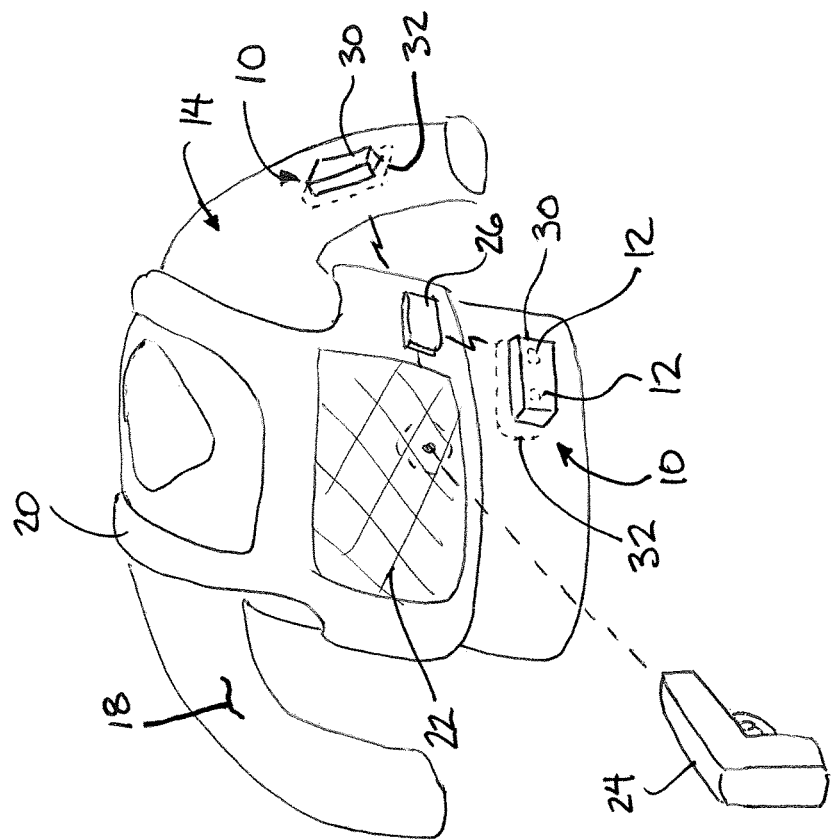
FIG. 1 is a schematic representation of the electrode assembly used in cooperation with a simulated combat stress exposure training system.
Figure 2:
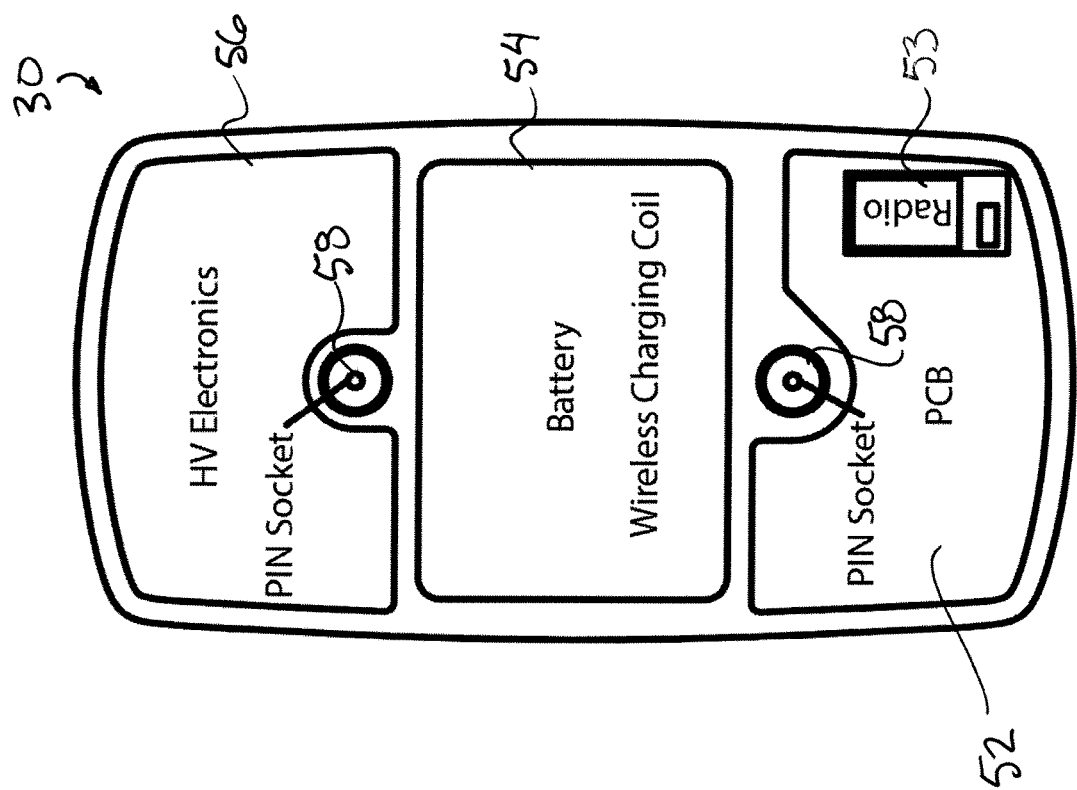
FIG. 2 is a schematic representation of the electrical components within the housing of the electrode assembly.
Figure 3:
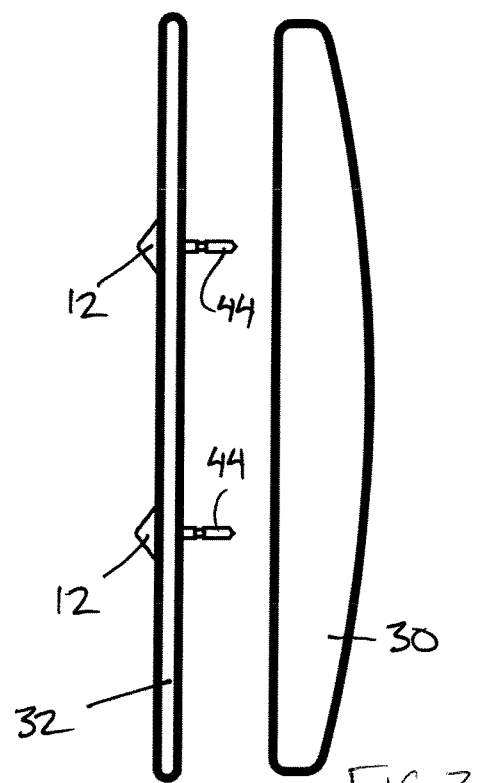
FIGS. 3 and 4 are top views of the electrode assembly in the released position and the mounted position respectively.
Figure 4:
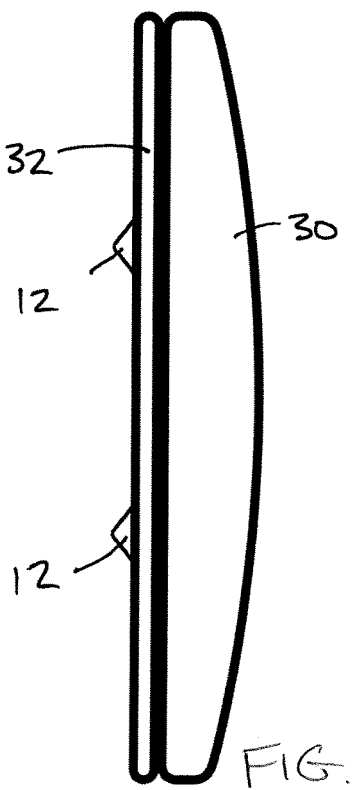
Figure 5:
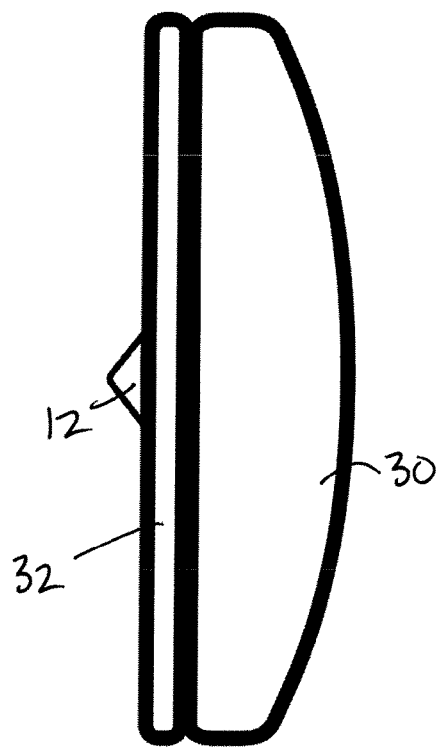
FIGS. 5 and 6 are side views of the electrode assembly in the released position and the mounted position respectively.
Figure 6:
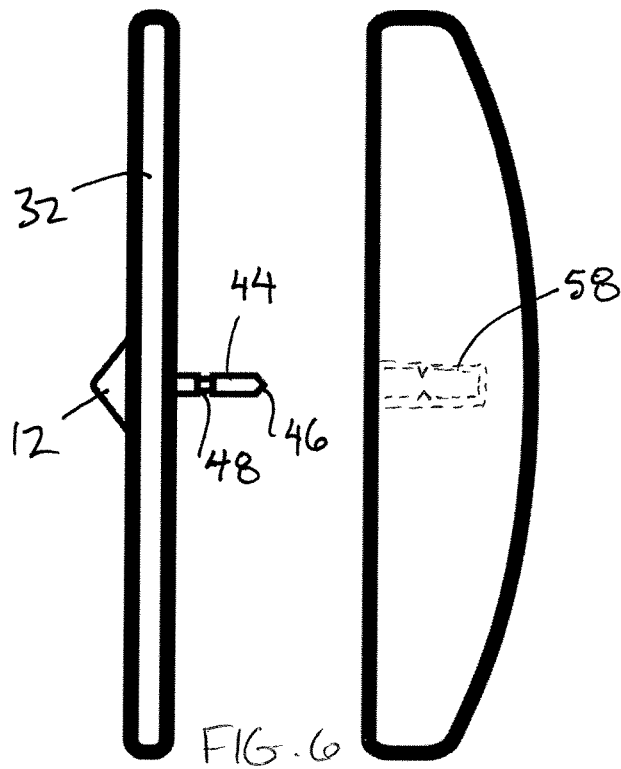
Figure 8:
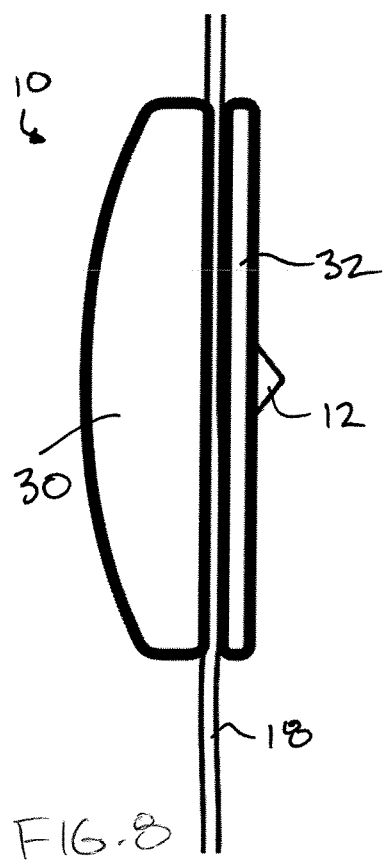
FIG. 8 is a side view of the electrode assembly in the mounted position attached to a garment.
Figure 9:
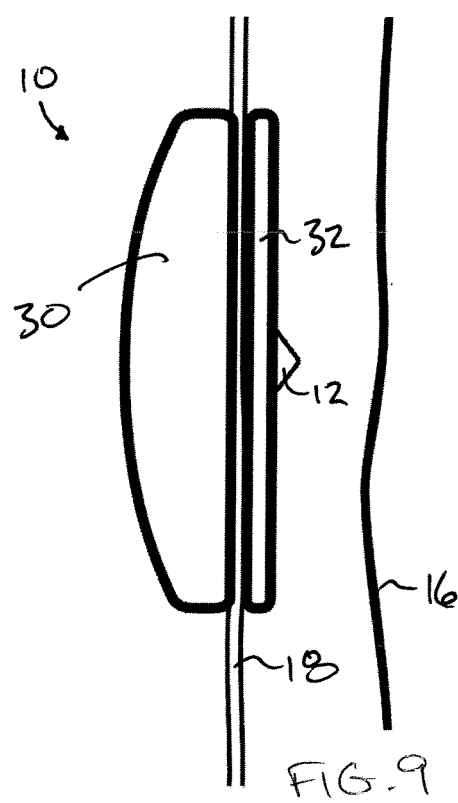
FIG. 9 is a side view of the electrode assembly in the mounted position as the garment is placed onto a user.
Figure 10:
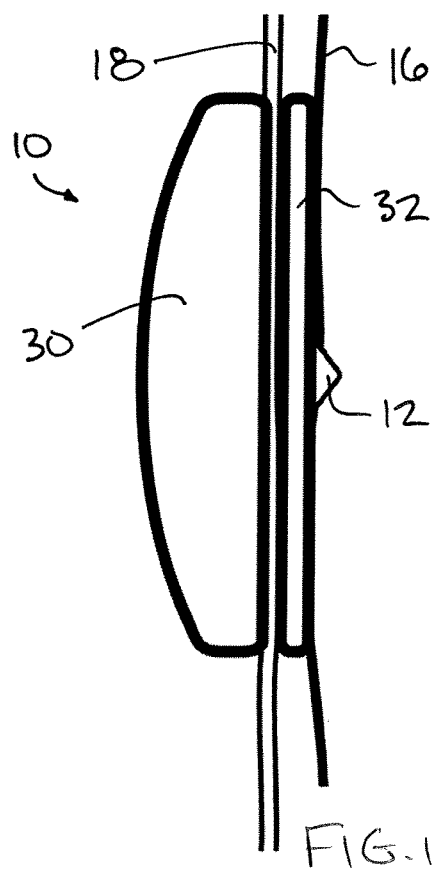
FIG. 10 is a side view of the electrode assembly in the mounted position with the garment worn by a user such that the electrodes contact the skin of the user.
Figure 7:
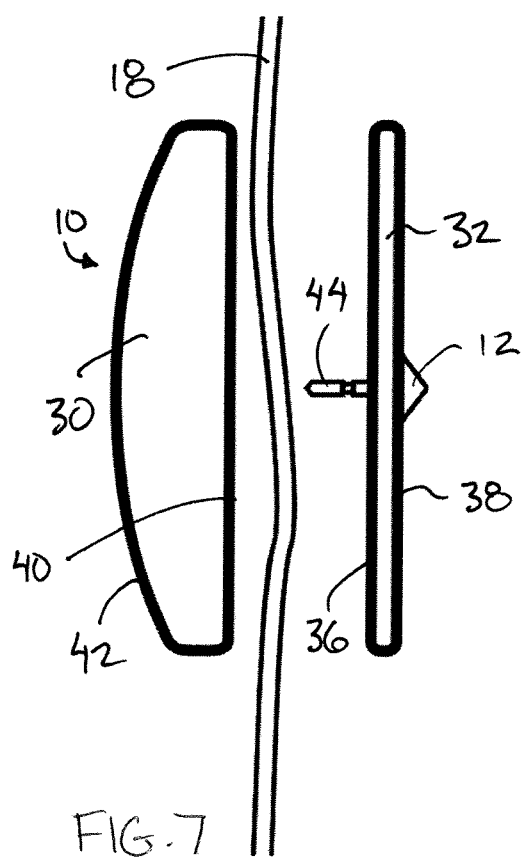
FIG. 7 is a side view of the electrode assembly in the released position prior to attachment to a garment.

Referring to the accompanying figures there is illustrated a garment supported electrode assembly generally indicated by reference numeral 10. The electrode assembly 10 is particularly suited for supporting one or more electrodes 12 relative to a garment 14 to be worn by a user 16.

The garment may be any type or shape to be worn about a portion of the body of the user, for example a shirt worn about the torso or pants worn about the legs of the user. The garment has a fabric layer 18, for example a woven knit type material, in which the garment is worn such that an inner surface of the fabric layer faces inwardly to lie against the skin of the user and an opposing outer surface of the fabric layer is located at an external side of the garment.

In some instances, the electrodes may be used in a medical environment to acquire a biological electrical signal emitted by the body of the user. In this instance, the electrodes acquire the signal from the body of the user such that the electrode assembly can further transmit the signal to an external electrical device used to interpret the signal.

In the illustrated embodiment, the electrodes 12 are used together with a stress exposure training system to simulate a stress exposure environment, for example a combat simulation system. In this instance, a target device, for example a vest 20 having signal receivers 22 thereon is worn by the user. A simulated weapon 24 may arranged to generate a coded pulsed beam of light to simulate a projectile. A controller 26 on the target device determines that the user has been hit with a simulated projectile during a training exercise when the signal receiver 22 receive the coded pulsed beam of light emitted by the simulated weapon 24. The controller 26 then generates a wireless activation signal that can be detected and received by the electrode assembly 10 to deliver a non-injurious, but painful electrical shock to the skin of the user as described in further detail below.

In some instances, multiple assemblies 10 may be worn on different parts of the garment 14 in which the different assemblies 10 each communicate wirelessly with a common main controller 26 as shown schematically in FIG. 1. Preferably, each assembly 10 responds to a unique wireless activation signal from the controller 26 so as to activate different assemblies 10 to deliver electrical shocks to different parts of the body based on different activation criteria stored on the controller 26.

In further embodiments, the controller 26 that generates the wireless activation signal for one or more assemblies 10 may be any type of electronic device capable of wireless communication with the assemblies 10, for example other simulated training equipment that can be triggered within a simulated environment for training, or a smartphone or tablet computer operated by an instructor monitoring the simulated environment for training.

The electrode assembly 10 generally includes a housing 30 arranged to be supported externally on the garment 14 and a pad 32 arranged to be supported internally on the garment. The housing 30 and the pad 32 are arranged to be connected to one another with the fabric layer 18 of the garment therebetween in a mounted position of the assembly, while remaining readily releasable from one another to remove the electrode assembly from the garment when no longer in use.

The housing 30 and the pad 32 are both elongate in a lateral direction between opposing ends 34 of the assembly. The housing 30 includes (i) an inner surface 36 facing inwardly to engage the outer surface of the fabric layer in the mounted position and (ii) an opposing outer surface 38 opposite the inner surface 36 and that faces outwardly away from the garment. The pad 32 similarly includes (i) an inner surface 40 facing towards the fabric layer to engage the inner surface of the fabric layer in the mounted position and (ii) an opposing outer surface 42 opposite the inner surface 40 so as to be arranged to be engaged against the skin of the user in the mounted position.

The pad 32 of the assembly 10 comprises a flat sheet having a minimal thickness between the inner surface 36 and the outer surface 38 as compared to the length of the faces in the lateral direction and the perpendicular width of the faces between the top and bottom edges thereof. The pad may be moulded of an electrically insulating material that is non-conductive and resilient for example rubber, a plastic or other resilient materials.

Alternatively, the pad 32 may comprise a rigid body. In this instance, the outer surface may be defined by a liner of resilient material for engagement with the skin of the user. The outer surface may be textured with ridges or grooves formed therein for better gripping relative to the skin of the user.

In the illustrated embodiment, two electrodes 12 are commonly mounted on the single body of the pad 32 at spaced apart positions in the lateral direction. In further embodiments, a single electrode 12 may be mounted on a single body of the pad 32 which in turn is coupled to a single housing 30, for example in applications where a biological signal emitted from the body of the user is acquired by the electrode. In yet further embodiments, the pad 32 may comprise two separate bodies each supporting a respective electrode therein in which the two bodies are commonly mounted on a single housing 30, for example to deliver an electrical shock through the two electrodes.

Each electrode 12 is mounted in a protruding relationship relative to the outer surface 38 of the pad that engages the user. The exterior head of the electrode may be cone shaped so as to be tapered outwardly and away from the surface of the pad towards a central apex of the electrode. Preferably the apex has an interior angle which is greater than 90° such that the apex is not too sharp in a manner that would cause discomfort to the user but remains pointed to form a firm contact of the tip of the electrode with the skin of the user.

Each electrode includes a first connector 44 associated therewith. In the illustrated embodiment the first connector 44 is a pin connector comprising a post connected to the exterior head of the electrode 12 to extend through a corresponding mounting aperture in the pad for protruding inwardly beyond the opposing inner surface 36 of the pad. The post forming the first connector 44 is round in cross-sectional shape and has an outer diameter which is much smaller than the diameter of the exterior head of the electrode 12.

The diameter of the post forming the first connector 44 is quite small and is tapered at the free end thereof to form a pointed tip 46 such that the first connector 44 can be readily self-penetrated through the fabric layer. When the fabric layer comprises a woven knit material with a tight weave having no visible gaps therein, the diameter of the first connector is such that the pointed tip is able to spread individual strands of the woven knit to allow passage of the first connector through the fabric in a non-destructive manner.

A retainer catch 48 is formed at an intermediate location along the post of the first connector at a location spaced from the inner surface 36 of the pad. The catch 48 is formed as a recessed groove extending about the full circumference of the post to assist in retaining the pad 32 in a mounted position relative to the housing as described in further detail below.

The exterior head of the electrode 12 and the post of the first connector 44 are formed as a continuous unitary body of conductive metal so that electrical signals can be communicated through the first connector 44 to the electrode and from the electrode through the first connector 44.

The housing 30 has an outer perimeter shape which is substantially identical to the outer perimeter shape of the pad 32. The inner side 40 that mounts against the fabric layer fully spans the length and width of the housing so as to be bound by the perimeter shape of the housing, similarly to the inner surface 36 that spans the complete interior side of the pad 32 so as to be bound by the perimeter shape of the pad. The inner surface 40 is flat and rigid.

A perimeter wall 50 defining the perimeter shape of the housing protrudes perpendicularly outwardly about the full perimeter of the inner surface 40. The outer surface 42 is smooth and rounded in profile and extends continuously from the perimeter wall such that the perimeter wall and the outer face 42 collectively form a smooth, domed structure which is generally convex in shape and which is devoid of any sharp edges or corners.

The housing has a hollow interior supporting various electrical components therein. This includes a printed circuit board 52 having a processor and a memory including programming instructions thereon which are arranged to be executed by the processor for performing the various functions of the assembly. The printed circuit board incorporates a wireless transceiver 53 therein which is arranged to transmit and receive wireless electronic signals for communicating information between the controller and an external electronic device such as the controller 26 of the training system shown in FIG. 1, to receive an activation signal and to activate delivery of an electrical shock to the user for example.

A battery 54 is also supported within the housing to provide electrical power to the printed circuit board 52. A wireless charging coil may be incorporated into the power supply circuit such that the battery is arranged to be charged by induction simply by placing the housing 30 in proximity to an induction charging unit.

An electrical impulse device 56 is also supported within the interior of the housing in communication with the controller 52 to receive electrical power from the battery 54. The electrical impulse device is also in communication with both of the electrodes in the mounted position as described in further detail below. When an activation signal with prescribed shock settings is received by the controller 52, the controller activates the electrical impulse device which in turn generates a high-voltage electrical signal for delivery to the electrodes to deliver a painful, yet non-injurious electrical shock to the user.

Electrical communication of the electrodes 12 with the electrical impulse device, as well as structural mounting of the pad 32 relative to the housing is accomplished by a pair of second connectors 58. Each second connector 58 is supported on the housing at the inner side thereof in alignment with a respective one of the first connectors 44. The second connectors 58 are thus laterally spaced apart from one another by a similar spacing as the first connectors 44. The second connectors 58 are also positioned relative to the perimeter shape of the housing in a similar manner as the first connectors 44 relative to the perimeter shape of the pad such that alignment of the perimeter shapes of the housing and pad in the mounted position is sufficient to align each first connector 44 with the corresponding second connector 58.

Each second connector 58 is a socket connector which is arranged to receive a respective one of the pin connectors of the first connector therein in the mounted position. The socket is formed of a conductive material and is tubular in shape, having an interior diameter which is very similar to the outer diameter of the post of the respective first connector 44. The post of the first connector 44 may be sized for a slight interference fit relative to the socket of the corresponding second connector 58 to ensure that the first connector is frictionally retained within the second connector in the mounted position while remaining releasable if the friction forces are overcome by a user pulling the pad and housing apart from one another.

A locking protrusion 60 is supported within each socket connector 58 to protrude inwardly beyond the inner diameter thereof for alignment with the catch 48 on the corresponding first connector 44. The protrusion 60 is preferably resiliently supported relative to the socket such that the protrusion can be flexed outwardly in non-interference with the interior diameter of the second connector 58 as the first connector is inserted therein; however, the protrusion 60 is biased into the interior space of the socket for insertion into the recessed groove of the catch 48 once the pad and housing are in the mounted position relative to one another. In this manner, the first connector 44 forms a snap-fit connection into the corresponding second connector.

The conductive material forming the tubular socket of each second connector is electrically and conductively connected to the electrical impulse device and the printed circuit board such that the electrical signal representing the impulse shock to be delivered to the user can be transmitted directly from the components within the housing to the electrodes 12 in contact with the skin of the user in the mounted position of the assembly.

The electrode assembly 10 as described herein can be used with a variety of different garments and the pin connectors 44 which are penetrated through the fabric material of the garment have a small diameter and a pointed tip for ease of penetration between the knit fibers of the fabric even when no visible holes are provided in the fabric, without causing any damage to the fabric.

The pad 32 is intended to be supported at the inner surface of the fabric layer while the housing is mounted at the outer surface. Once the first connectors 44 are penetrated through the fabric layer and inserted into the corresponding second connectors of the housing, the housing is ready for pairing with an additional electronic device, for example (i) a controller 26 of the combat simulation system described above, or (ii) in the instance of medical electrodes, other external medical equipment capable of interpreting biologically emitted electrical signals captured by the electrodes. In the illustrated embodiment, when a pulsed signal hits the sensor of the target device such that the controller 26 generates an activation signal transmitted wirelessly to the controller 52 of the electrode assembly, the controller 52 of the electrode assembly 10 activates the electrical impulse device to generate an electrical signal delivered to the electrodes which causes an electrical shock to be delivered to the user.

When use is no longer required, the electrode assembly can be removed from the garment by overcoming the retention forces of the first connectors 44 received within the second connectors 58 and the retention force of the resiliently supported locking protrusions 60 to separate the pad and housing from one another for subsequent removal from the fabric material. When using the assembly with the new user, the pad 32 supporting the electrodes 12 thereon which contacts the user can be simply replaced and the housing containing the various electrical components noted above can be reused with a different pad 32 interchanged thereon while similarly supporting the assembly on a new garments associated with the new user. The simplicity of interchanging the pad 32 minimizes the amount of sanitation required between different uses on different users as the externally supported housing requires thorough cleaning between uses.

Since various modifications can be made in my invention as herein above described, and many apparently widely different embodiments of same made, it is intended that all matter contained in the accompanying specification shall be interpreted as illustrative only and not in a limiting sense.

The invention claimed is:

1. An electrode assembly for attachment to a garment worn by a user, the garment having a fabric layer with an inner surface supported against the user and an outer surface opposite the inner surface at an exterior of the garment, the electrode assembly comprising:
    at least one electrode arranged to directly contact the user;
    a pad supporting said at least one electrode thereon wherein the pad is arranged for mounting against the inner surface of the fabric layer;
    a first connector associated with said at least one electrode wherein the first connector is supported on the pad;
    a housing arranged to be supported externally against the outer surface of the fabric layer, the housing including an electronic component therein;
    a second connector supported on the housing in association with the first connector;
    one of the first connector and the second connector comprising a pin connector and another one of the first connector and the second connector comprising a socket connector;
    the socket connector being arranged to receive the pin connector therein to releasably attach the housing to the pad in a mounted position of the assembly;
    the pin connector being shaped to be self-penetrating through the fabric layer in a non-destructive manner so as to be arranged for insertion through the fabric layer between the pad at the inner surface and the housing at the outer surface in the mounted position; and said at least one electrode and the electronic component being in electrical communication with one another in the mounted position so as to be arranged to communicate an electrical signal between said at least one electrode and the electronic component on the housing in the mounted position.

2. The assembly according to claim 1 wherein the pin connector includes a recess formed therein defining a catch arranged to be engaged by the socket connector.

3. The assembly according to claim 2 wherein the recess comprises an annular groove extending about a circumference of the pin connector.

4. The assembly according to claim 1 wherein the pin connector and the socket connector are formed of conductive material defining a conductive path arranged to communicate the electrical signal between said at least one electrode and the electronic component on the housing in the mounted position.

5. The assembly according to claim 1 wherein said at least one electrode is conical in shape so as to be tapered outwardly from the pad towards an apex.

6. The assembly according to claim 5 wherein the apex has an interior angle that is greater than 90 degrees.

7. The assembly according to claim 1 wherein said at least one electrode comprises a pair of electrodes, each electrode having a respective first connector associated therewith which connects the electrode to the electronic component of the housing.

8. The assembly according to claim 7 wherein the pad comprises a single body commonly supporting both electrodes therein.

9. The assembly according to claim 1 wherein the pad has an outer surface for engaging the user, the outer surface being formed of a resilient material.

10. The assembly according to claim 1 wherein the pad has an outer surface for engaging the user, the outer surface being textured for gripping the user.

11. The assembly according to claim 1 wherein the pad has an outer surface for engaging the user, the outer surface being formed of a non-conductive, electrically insulating material.

12. The assembly according to claim 1 further comprising a battery supported on the housing so as to be arranged to deliver an electrical signal from the housing to the user through said at least one electrode.

13. The assembly according to claim 1 wherein (i) the housing has an inner surface for abutment against the fabric layer bound by a prescribed perimeter shape of the housing, (ii) the pad has an inner surface for abutment against the fabric layer bound by a prescribed perimeter shape of the pad, and (iii) the prescribed perimeter shape of the housing and the prescribed perimeter shape of the pad being substantially identical to one another.

14. The assembly according to claim 1 wherein the housing has an outer surface opposite the second connector on the housing, the outer surface having a smooth convex shape.

15. The assembly according to claim 1 wherein the electronic component of the housing includes (i) a controller having a processor and a memory storing programming instructions arranged to be executed by the processor, and (ii) a transceiver connected to the controller so as to be arranged to communicate signals wirelessly between the controller and an external electronic device.

16. The assembly according to claim 1 wherein the electronic component of the housing includes an electrical impulse device supported on the housing in communication with said at least one electrode so as to be arranged to deliver an electrical impulse to the user through said at least one electrode that causes non-injurious pain to the user.

17. The assembly according to claim 1 wherein the electrical component of the housing is arranged to (i) receive a biological signal that is (a) emitted by a body of the user and (b) acquired by said at least one electrode, and (ii) transmit the biological signal to an external electronic device.

18. An electrode assembly for attachment to a garment worn by a user, the garment having a fabric layer with an inner surface supported against the user and an outer surface opposite the inner surface at an exterior of the garment, the electrode assembly comprising:

two electrodes arranged to directly contact the user;

at least one pad supporting the electrodes thereon, wherein said at least one pad is arranged for mounting against the inner surface of the fabric layer;

a first connector supported on said at least one pad;

a housing arranged to be supported externally against the outer surface of the fabric layer, the housing including an electronic component therein;

a second connector supported on the housing in association with the first connector;

one of the first connector and the second connector comprising a pin connector and another one of the first connector and the second connector comprising a socket connector;

the socket connector being arranged to receive the pin connector therein to releasably attach the housing to the pad in a mounted position of the assembly; and the electrodes and the electronic component of the housing being in electrical communication with one another in the mounted position so as to be arranged to communicate an electrical signal between the electrode and the electronic component on the housing in the mounted position.

19. The assembly according to claim 18 wherein said at least one pad comprises a single body commonly supporting both electrodes therein.

20. The assembly according to claim 18 wherein the electronic component of the housing includes an electrical shock generator supported on the housing in communication with the electrodes so as to be arranged to deliver an electrical impulse to the user through the electrodes that causes non-injurious pain to the user.

* * * * *